United States Patent
Nambu et al.

(10) Patent No.: US 8,600,321 B2
(45) Date of Patent: Dec. 3, 2013

(54) RADIO TRANSMITTER AND ENVELOPE TRACKING POWER SUPPLY CONTROL METHOD

(75) Inventors: Hiroi Nambu, Yokohama (JP); Masami Ohnishi, Hachioji (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 13/477,108

(22) Filed: May 22, 2012

(65) Prior Publication Data

US 2012/0309333 A1 Dec. 6, 2012

(30) Foreign Application Priority Data

Jun. 3, 2011 (JP) .................................. 2011-125505
Mar. 7, 2012 (JP) .................................. 2012-050185

(51) Int. Cl.
*H01Q 11/12* (2006.01)
*H04B 1/04* (2006.01)
(52) U.S. Cl.
USPC ...................................................... 455/127.1
(58) Field of Classification Search
USPC ........................................... 455/127.1, 127.2
See application file for complete search history.

(56) References Cited

U.S. PATENT DOCUMENTS

2006/0068697 A1* 3/2006 Tanabe et al. ...................... 455/1
2011/0053532 A1* 3/2011 Fudaba et al. ............. 455/127.1

FOREIGN PATENT DOCUMENTS

| JP | 62-277806 A | 12/1987 |
| JP | 03-198513 A | 8/1991 |
| JP | 10-136309 A | 5/1998 |
| JP | 2004-336636 A | 11/2004 |
| JP | 2008-511065 A | 4/2008 |
| WO | 2006/021790 A1 | 3/2006 |

* cited by examiner

*Primary Examiner* — Nguyen Vo
(74) *Attorney, Agent, or Firm* — Volpe and Koenig, P.C.

(57) ABSTRACT

The envelope tracking power supply includes a plurality of variable voltage supplies. A power supply controller of a power amplifier controls the plurality of variable voltage supplies so as to precisely divide the power supply voltage in a high frequency area, based on the voltage distribution of a received transmitted base band signal, in order to maximize the power added efficiency of the power amplifier. The power supply controller includes a threshold memory including a plurality of first zones, and a frequency memory including a plurality of second zones. The power supply controller changes the threshold held in the first zones so that each second zone approaches the average of the second zones.

2 Claims, 18 Drawing Sheets

RADIO TRANSMITTER AND ENVELOPE TRACKING POWER SUPPLY CONTROL METHOD

CLAIM OF PRIORITY

The present application claims priority from Japanese patent application serial nos. 2011-125505 and 2012-050185, filed on Jun. 3, 2011, and Mar. 7, 2012, the contents of which are hereby incorporated by reference into this application.

FIELD OF THE INVENTION

The present invention relates to a radio transmitter and an envelope tracking power supply control method. More particularly, the present invention relates to a radio transmitter that improves the power added efficiency (PAE) by controlling a power supply, and to a method for controlling an envelope tracking power supply.

BACKGROUND OF THE INVENTION

In power amplifiers used in base stations in mobile or wireless communications, the improvement in the power added efficiency (PAE) is required in order to reduce operational costs. One of the PAE improvement technologies that have recently attracted attention is envelope tracking (hereinafter referred to as ET). In an RF power amplifier, PAE is defined as the ratio of the difference of the output and input signal power to the DC power consumed.

Before describing ET, the characteristics of the transistor used in a common power amplifier will be described. The output power and PAE characteristics with respect to the input power of the transistor will be described with reference to FIG. 1. In FIG. 1, the horizontal axis represents the input power, and the vertical axis represents the output power and PAE. As the input power increases, the output power saturates. The PAE is highest in the vicinity of the saturated output power.

Referring to FIGS. 2A and 2B, description will be given of the output characteristics and the PAE characteristics when the transistor power supply voltage Vdd is varied by 5 V from 50 V to 10 V. In FIG. 2A, the saturated power of the transistor varies depending on the power supply voltage. In FIG. 2B, the input power value at which the PAE is maximum is different for each power supply voltage.

Next, ET will be described. ET is a technology that improves the PAE by allowing the power supply voltage of the transistor within the power amplifier to vary according to the envelope of an input signal. The principle of ET will be described with reference to FIG. 3. In FIG. 3, essential components of ET include an envelope detection unit, an envelope tracking power supply (ET power supply), and a power amplifier.

The envelop information of the input signal that is detected by the envelope detection unit is transmitted to the ET power supply. The ET power supply outputs a voltage having a shape corresponding to the envelope information. In this way, the power amplifier (transistor) allows the power supply voltage to vary to be able to typically operate with the maximum PAE in the vicinity of the saturated power, with respect to the input power. Thus, the ET improves the PAE. FIG. 3 shows an example of operating the ET by detecting the envelope from the transmitted RF signal. However, it is also possible to control the ET operation by a discrete voltage value by using the signal amplitude obtained by digital calculation.

The PAE when the power supply voltage of the transistor is fixed and the PAE when the ET is operated will be compared with reference to FIG. 4. In FIG. 4, the horizontal axis represents the input voltage, and the vertical axis represents the PAE. The PAE when the power supply voltage is fixed is lower than the PAE when the ET is operated. The ET uses the characteristics of the transistor. The transistor allows the power supply voltage to vary to be able to typically operate with the maximum PAE in the vicinity of the saturated power, with respect to the input power. Thus, the PAE when the ET is operated is higher than when the power supply voltage is fixed in a wide input power range.

Particularly, it is possible to take advantage of the characteristics of ET that the PAE is high in a wide input power range with respect to signals with the peak power higher than the average power, as in the digitally modulated waves using modulation schemes such as Code Division Multiple Access (CDMA), Wideband Code Division Multiple Access (WCDMA), and Frequency Division Multiplexing (FDM) that are used in recent mobile communication.

However, when the ET is applied to the signal with the peak power higher than the average power, it is necessary to have an ET power supply with a wide dynamic range to be able to properly output any voltage.

Known examples of ET power supply are disclosed in JP-A No. 511065/2008 and JP-A No. 277806/1987. The background of the technology will be described with reference to FIGS. 5A and 5B. JP-A Nos. 511065/2008 and 277806/1987 both disclose a method for configuring an ET power supply by using a plurality of voltage supplies. In FIG. 5A, an ET power supply 1300 includes a plurality of constant voltage supplies that are provided so that the rated supply voltage Vdd of a power amplifier is equally divided. The ET power supply 1300 outputs a voltage corresponding to the envelope signal from the envelope detection unit. The output voltage of the ET power supply having a plurality of voltage supplies has a step-like shape as shown in the dashed line in FIG. 5B.

JP-A No. 136309/1998 discloses a technology called Peak Factor Reduction (hereinafter referred to as PFR) that reduces the difference between the average power and the peak power of a signal by reducing the peak power included in the signal. The PFR prevents the high power input itself. The PFR reduces the output dynamic range that is required for the power supply to allow the power supply voltage to precisely vary with respect to the input range of higher occurrence probability. Thus, the PFR improves the PAE. The PFR is the technology that allows the power amplifier operating at a fixed voltage to reduce the peak power included in the signal. This can reduce the difference between the average power and the peak power of the signal, allowing the power amplifier to operate at higher PAE. This technology is currently used by many mobile communication transmitters.

JP-A No. 198513/1991 discloses a power amplifier of a combination of ET and distortion compensation. Further, JP-A No. 336626/2004 discloses a power amplifier that makes the power supply voltage constant at low output power by changing the power supply voltage at higher output power.

SUMMARY OF THE INVENTION

A plurality of voltage supplies are prepared. Then, a voltage is selected and output from the plurality of voltage supplies so that the power amplifier can operate at the max PAE with respect to the input signal. In this case, being more precise selection of the power supply voltage is an important factor in the improvement of the PAE of the power amplifier. This is because, as described with reference to FIG. 2, the power supply voltage at which the power amplifier operates at the max PAE varies depending on the input power. In the case of using the digitally modulated wave in which the input power typically varies, smoothly tracking the envelope of the input signal is ideal for obtaining the max PAE. Thus, in the ET power supply for outputting discrete voltage from a plurality of voltage supplies, it is possible to more accurately track the envelope of the input signal. In other words, the larger the number of voltages that can be selected, the more possible it is to approach the power supply voltage at which the PAE is the maximum in the power amplifier. As a result, the PAE is improved.

As described above, the difference between the average power and the peak power is large in the digitally modulated waves such as CDMA, WCDMA, and FDM. However, not only the power difference but also the difference in the occurrence probability is large in these digitally modulated waves. More specifically, the occurrence probability is Rayleigh distribution that is shown in FIG. 6. As can be seen from FIG. 6, in these digitally modulated waves, the occurrence probability is the highest in the vicinity of the average power and the occurrence probability is low in other parts.

The present invention provides a radio transmitter that allows ET to operate at higher PAE by controlling the ET power supply to output the voltage according to the signal power distribution.

The above aim is achieved by a radio transmitter including an envelope tracking power supply for supplying power to a power amplifier, the power amplifier for amplifying an analog high frequency signal, and a power supply controller for controlling the envelope tracking power supply. The envelope tracking power supply includes a plurality of variable voltage supplies. The power supply controller controls the plurality of variable voltage supplies so as to precisely divide the power supply voltage in a high frequency area, based on the voltage distribution of a received transmitted base band signal.

Further, there is also provided a radio transmitter including an envelope tracking power supply for supplying power to a power amplifier, the power amplifier for amplifying an analog high frequency signal, and a power supply controller for controlling the envelope tracking power supply. The envelope tracking power supply includes a plurality of variable voltage supplies. The power supply controller stores PAE characteristics of the power amplifier, as well as the signal power distribution information for each modulation method in an internal memory. The power supply controller receives information on the modulation method of the transmitted RF signal, reads the signal power distribution information of the corresponding modulation method, as well as the PAE characteristics of the power amplifier from the internal memory based on the received information, fixes the voltage and increase the number of voltage options in the power range of low occurrence probability in the transmitted signal, generates a control function for increasing the number of selectable voltages in the power range of high occurrence probability, and controls the envelope tracking power supply.

Still further, there is provided a method for controlling an envelope tracking power supply in a radio transmitter. The radio transmitter includes an envelope tracking power supply for supplying power to a power amplifier, the power amplifier for amplifying an analog high frequency signal, and a power supply controller for controlling the envelope tracking power supply. The envelope tracking power supply control method includes the steps of: determining data zones of class; storing the data zones in a first memory; calculating an amplitude of a transmitted base band signal to determine which of the data zones corresponds to the calculated amplitude; storing the corresponding data zone in a second memory; after the step of storing in the second memory has been executed for a predetermined number of times, comparing the adjacent zones of the second memory; and changing the data zone stored in the first memory based on the comparison result.

By controlling the ET power supply to output the voltage according to the signal power distribution, ET operation with higher PAE can be achieved.

BRIEF DESCRIPTION OF THE DRAWINGS

Preferred embodiments of the present invention will now be described in conjunction with the accompanying drawings, in which;

FIG. 17 is a view showing the transition of the content stored in a threshold memory;

FIG. 18 is a view showing the transition of the content stored in a frequency memory.

DETAILED DESCRIPTION OF THE PREFERRED EMBODIMENTS

Figure 1:
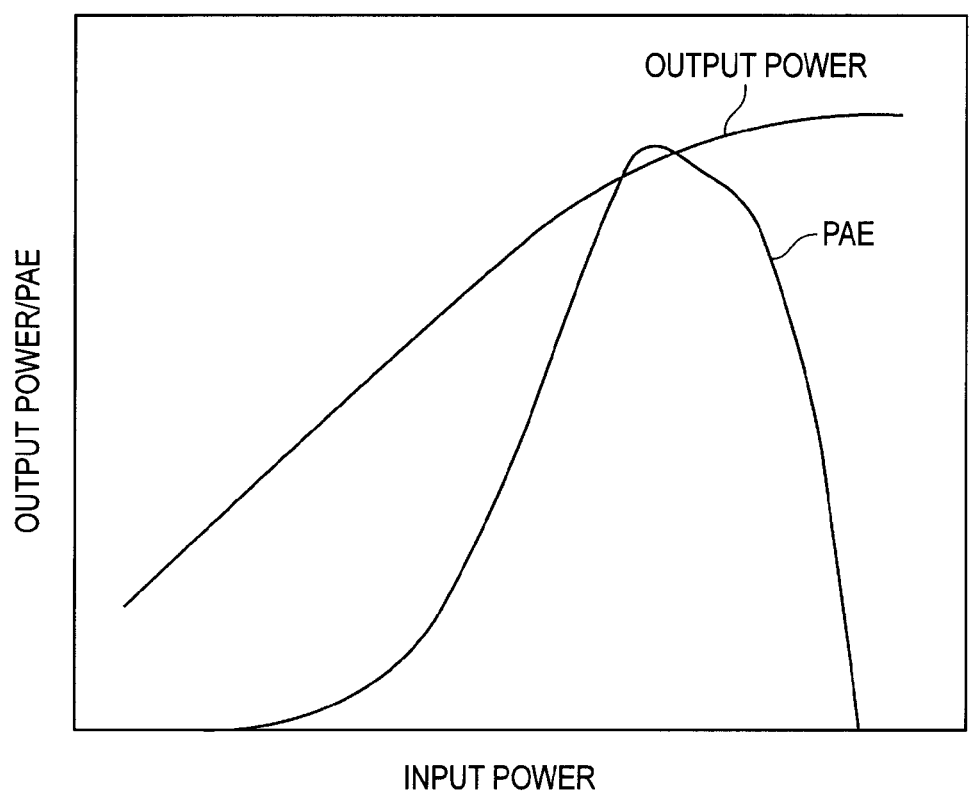
FIG. 1 is a graph showing the input/output and PAE characteristics of a transistor.

In the following, the present invention will be described using examples with reference to the accompanying drawings. Like elements or components in the drawings are designated by the same reference numerals and will not be redundantly described.

First Embodiment

Figure 7:
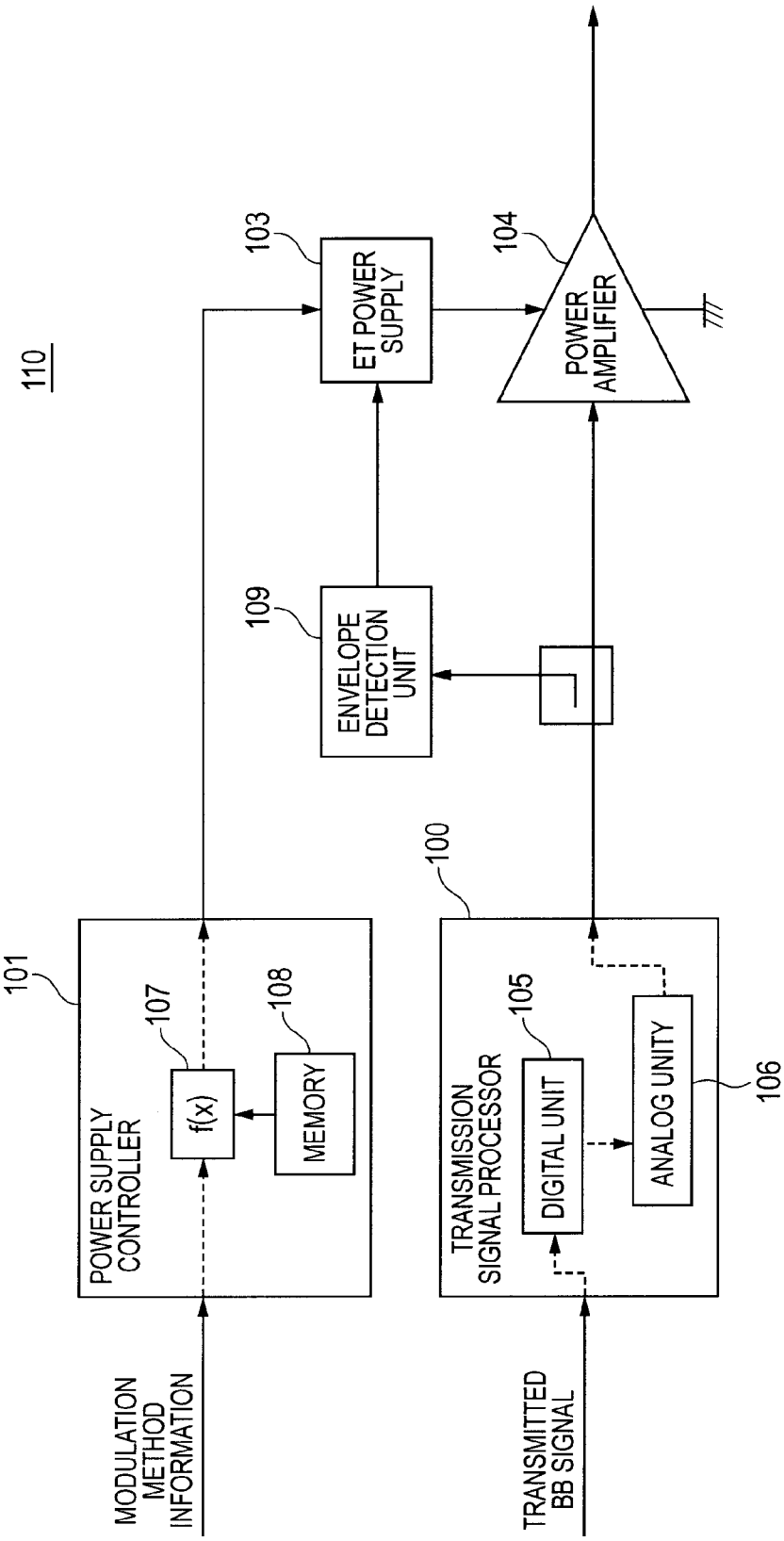
FIG. 7 is a block diagram of a transmitter.

The configuration of a radio transmitter will be described with reference to FIG. 7. Note that the operation principal of an ET power supply is as described above, and the description thereof will be omitted. In FIG. 7, a radio transmitter 110 includes a transmission signal processor 100, a power supply controller 101, an ET power supply 103, a power amplifier 104, and an envelope detection unit 109. The transmission signal processor 100 includes a digital unit 105 and an analog unit 106. The power supply controller 101 includes a memory 108 and a function generator 107.

The digital unit 105 receives a transmitted base band (BB) signal that is transmitted from the upper device. The digital unit 105 sets the transmission power, the transmission frequency, the number of transmission carriers and the like, and transmits them to the analog unit 106. The analog unit 106 converts the BB signal received from the digital unit 105 into an analog high frequency signal. Then, the analog unit 106 outputs the analog high frequency signal to the power amplifier 104.

Figure 2A:
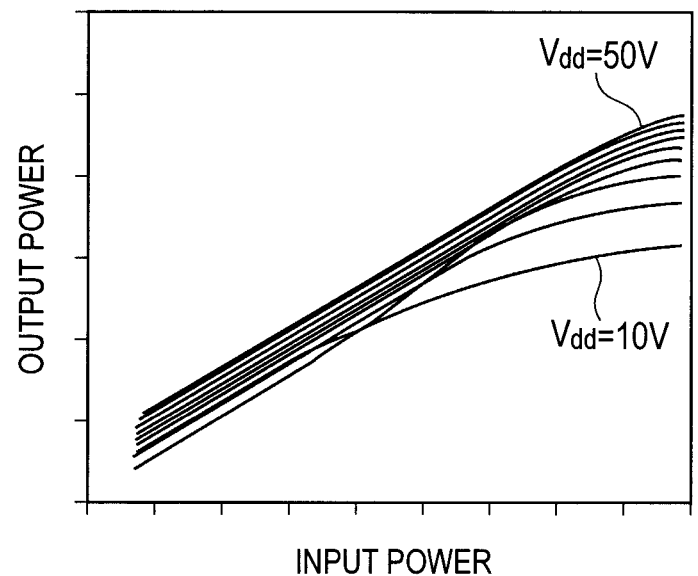
FIG. 2A is a graph showing the input/output characteristics of the transistor when the power supply voltage is changed.
Figure 2B:
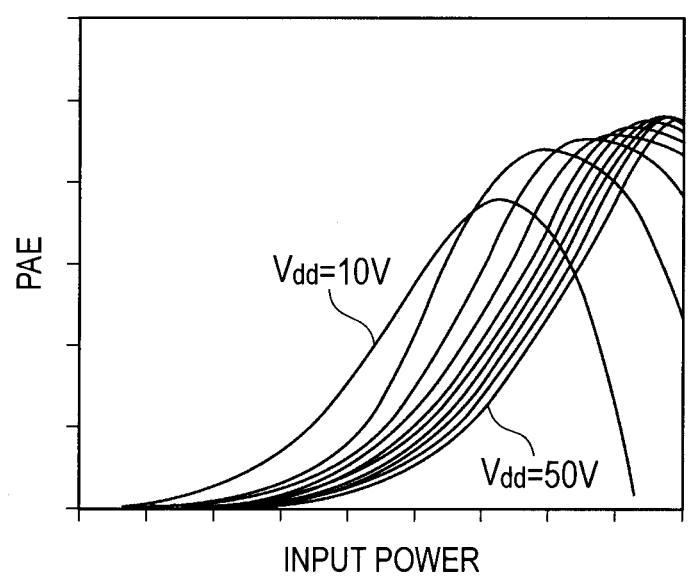
FIG. 2B is a graph showing the PAE characteristics of the transistor when the power supply voltage is changed.
Figure 3:
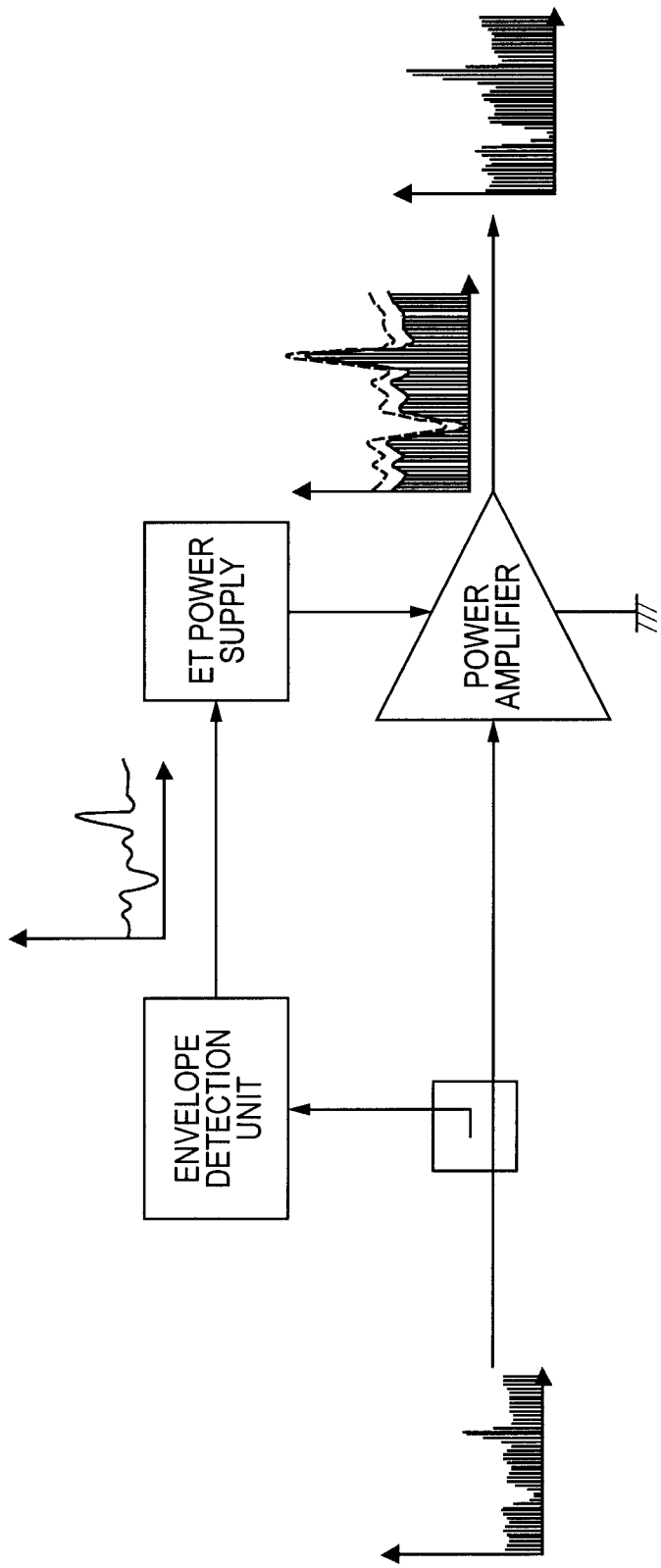
FIG. 3 is a block diagram showing the principle of ET.
Figure 4:
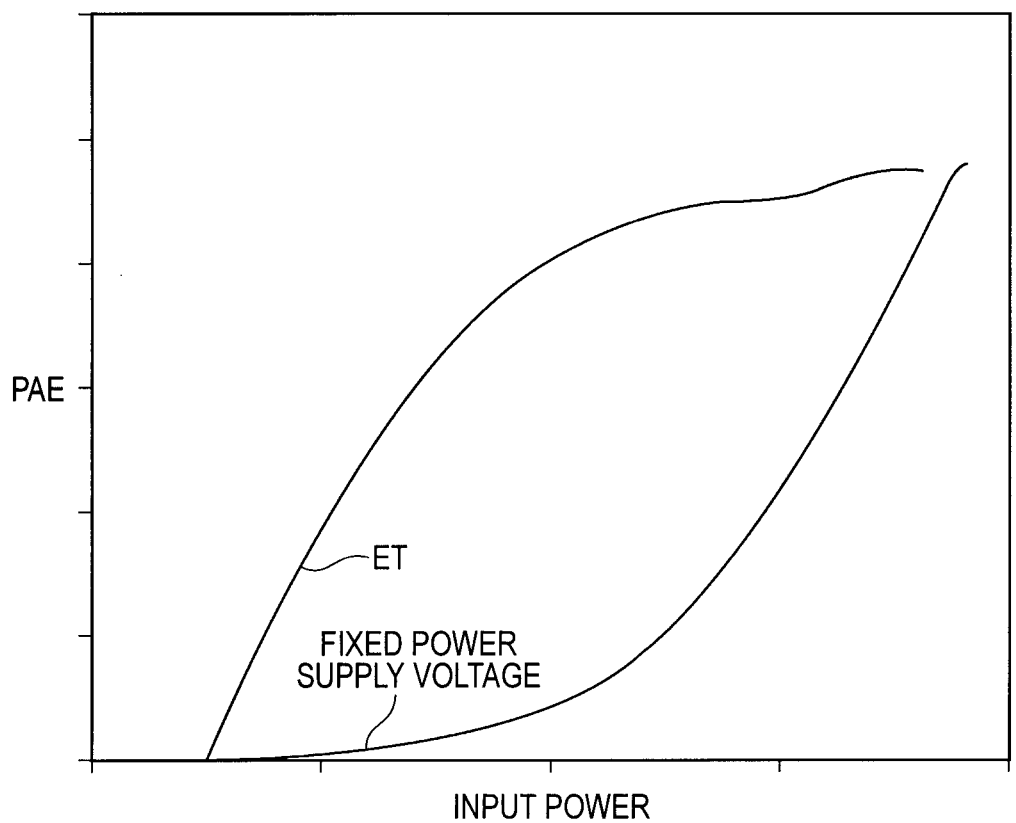
FIG. 4 is a graph showing the PAE comparison between ET and fixed voltage.
Figure 5A:
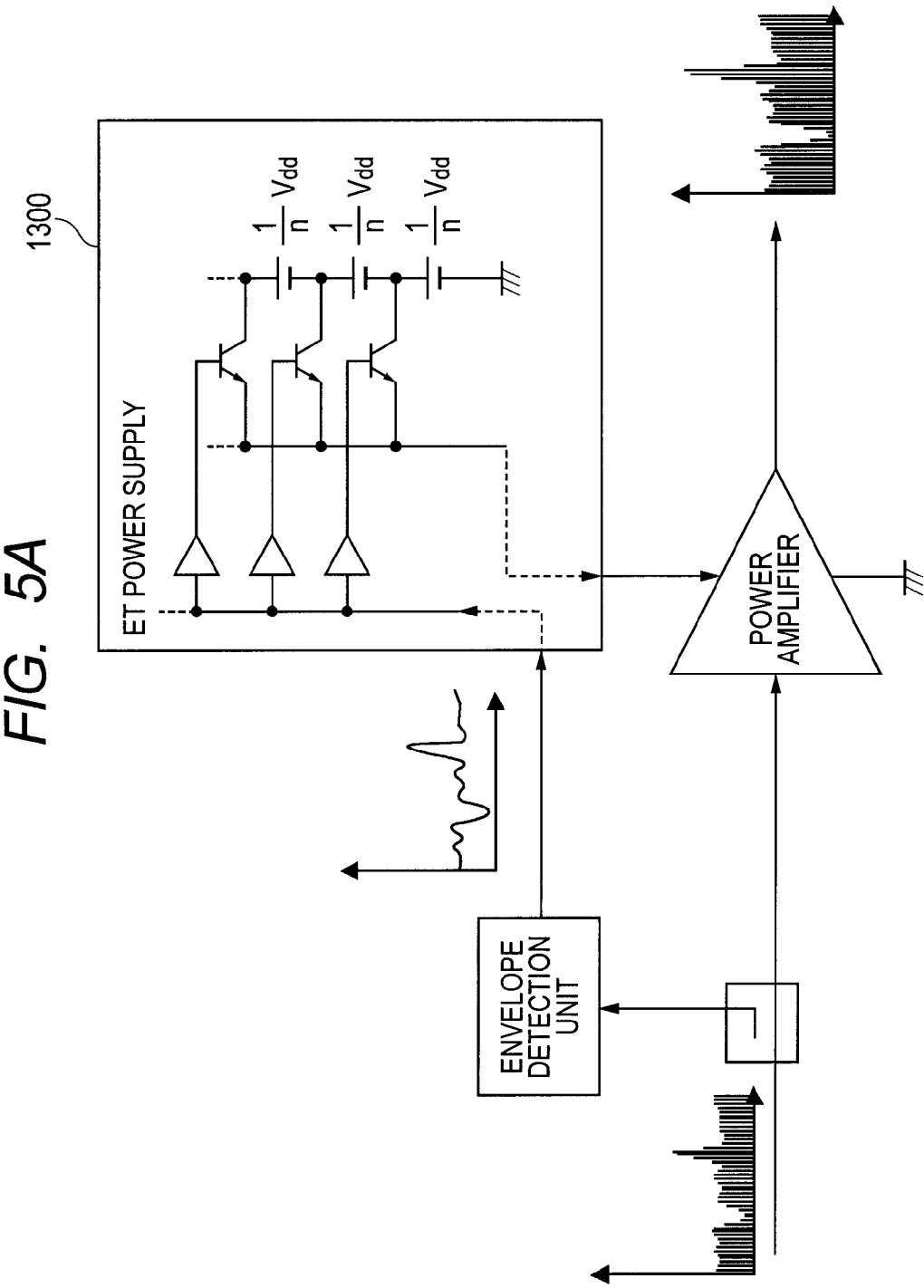
FIG. 5A is a block diagram of ET.
Figure 5B:
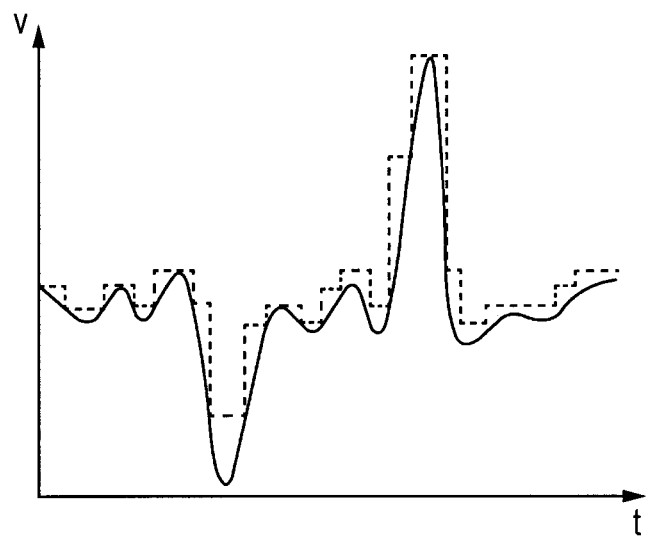
FIG. 5B is a graph showing the output voltage of the ET.
Figure 6:
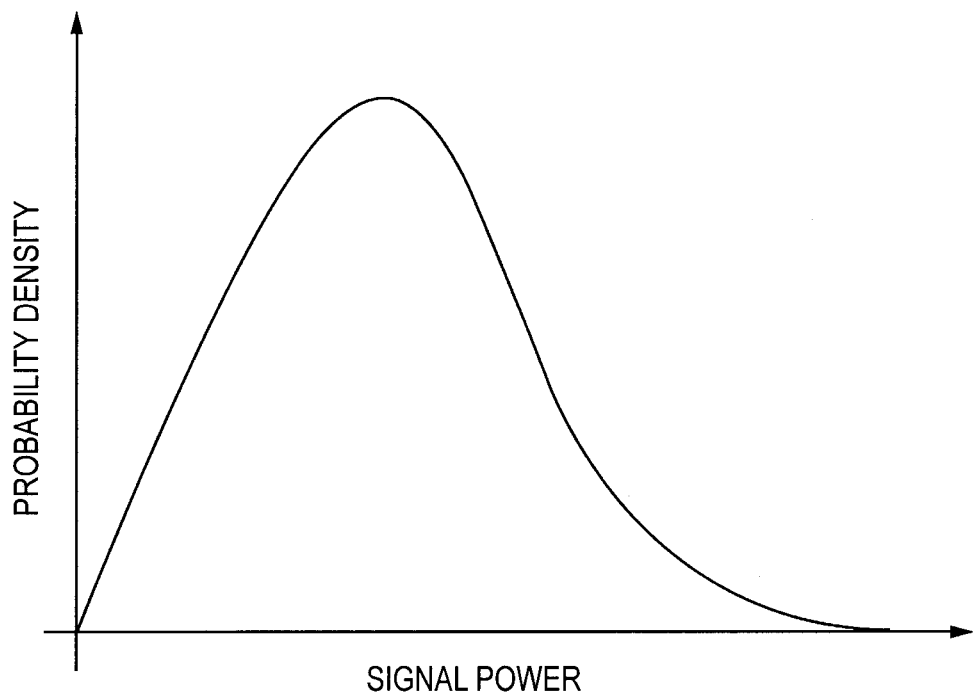
FIG. 6 is a graph showing the power distribution of a digitally modulated signal.

The memory 108 stores in advance the power distribution information for each of the modulation methods such as CDMA, WCDMA, and FDM. The memory 108 also stores in advance the PAE characteristics of the power amplifier 104. More specifically, the power distribution information of the digitally modulated wave is Rayleigh distribution shown in FIG. 6. The probability density function is stored in the memory 108. Further, the PAE characteristics of the power amplifier 104 are the data of the input/output versus PAE characteristics due to the difference in the power supply voltage shown in FIG. 2B.

The function generator 107 receives the information such as the modulation method of the transmitted signal from the upper device. Then, the function generator 107 controls so that the power supply voltage can be precisely changed to the voltage passing through the max PAE point in each input voltage, in the input range of high occurrence probability, based on the information in the memory 108.

The specific operation of the power supply controller 101 will be described. The function generator 107 reads necessary information from the memory 108. The function generator 107 first determines the minimum voltage at which the power amplifier 104 can operate as an amplifier in the PAE characteristics of the power amplifier 104. This voltage is the lower voltage of the ET power supply 103. The minimum voltage is denoted by V0.

The minimum voltage prevents that the power amplifier 104 does not operate as an amplifier with no gain when the power voltage is too low. Next, the function generator 107 extracts the power supply voltage at which the PAE is the maximum in each input signal voltage from the PAE characteristics of the power amplifier 104. The function generator 107 generates a function passing through all the points of the power supply voltages extracted from the PAE characteristics of the power amplifier 104.

Figure 8:
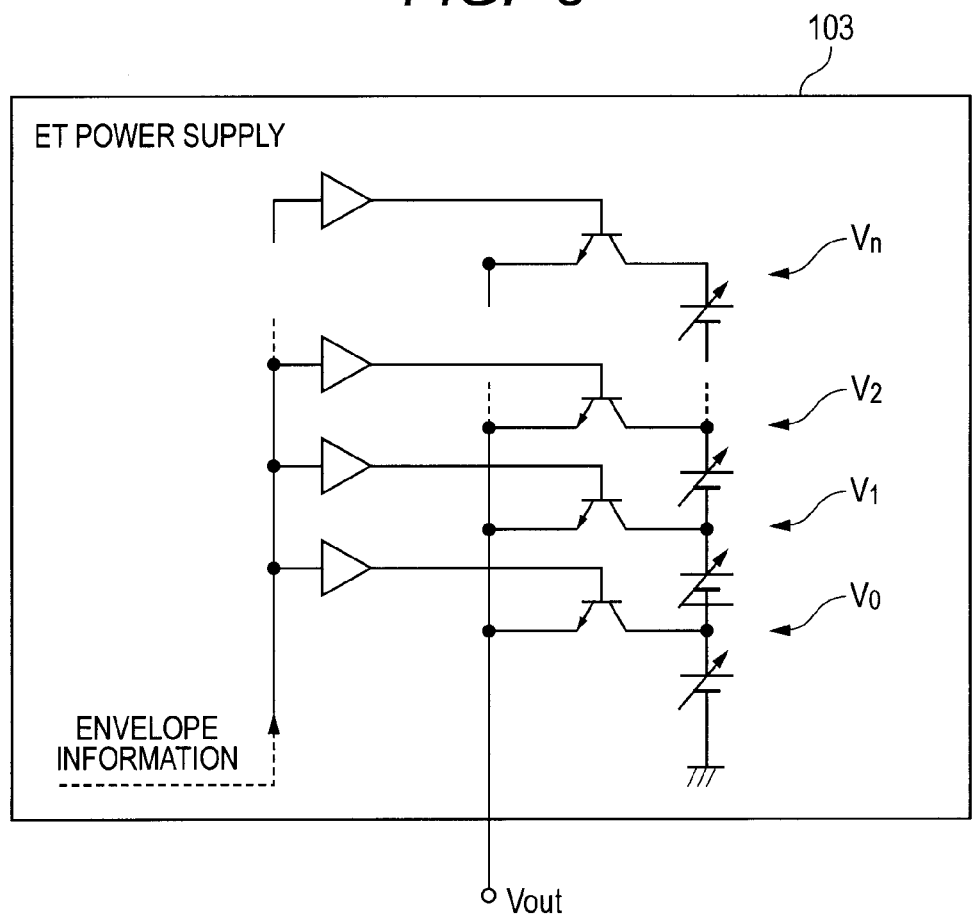
FIG. 8 is a circuit diagram of an ET power supply.

The configuration of the ET power supply will be described with reference to FIG. 8. Note that the basic operation principle is the same as that of the conventional technology, and the detailed description will be omitted. The first embodiment is different from the conventional technology in that each voltage supply is not a fixed voltage supply but a variable voltage supply that changes the output voltage according to the control signal from the power controller 101. In FIG. 8, the output voltage of the variable voltage supply in the first stage is V0. The number of stages of the variable power supply is (n+1) stages. Further, the following condition is satisfied: V0+V1+V2+ . . . +Vn=Vdd.

Figure 9:
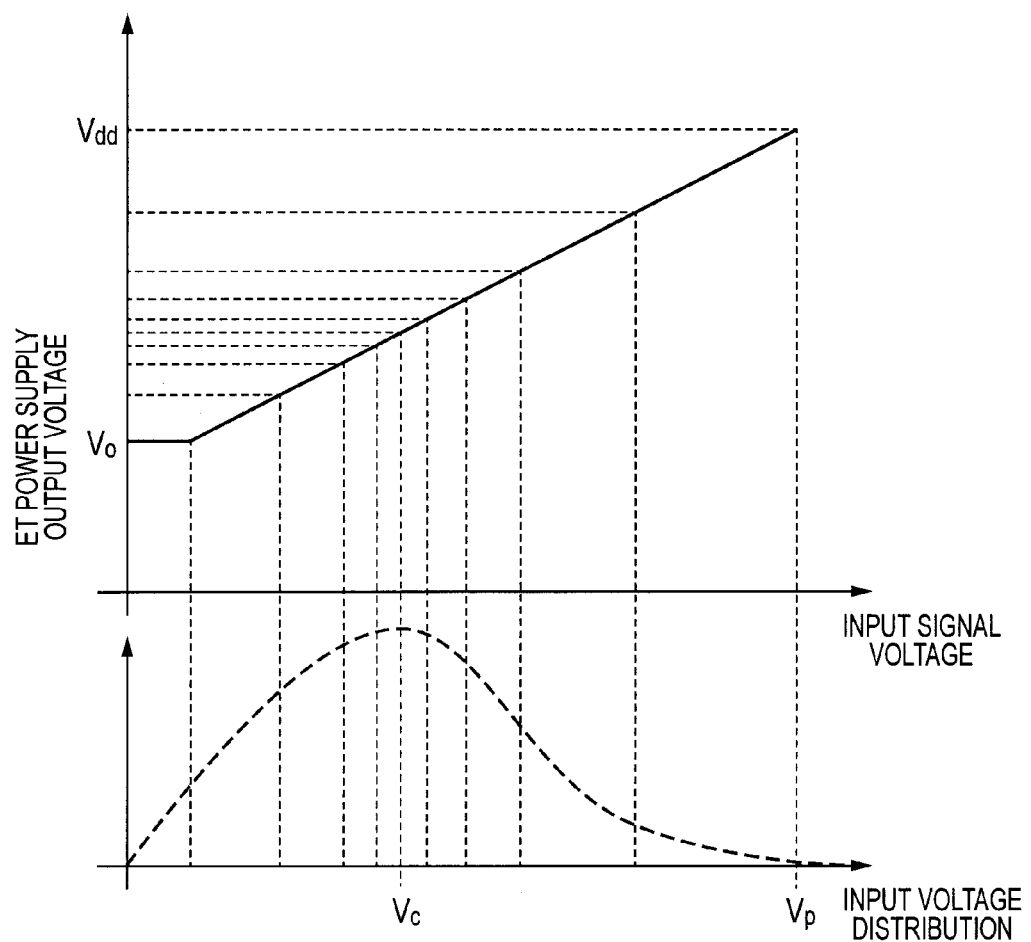
FIG. 9 is a view showing the control function.

The function generated by the function generator 107 will be described with reference to FIG. 9. The lower part of FIG. 9 shows the probability density with respect to the input voltage. The upper part of FIG. 9 shows the output voltage of the ET power supply with respect to the input voltage. The lower part of FIG. 9 is the same as FIG. 6.

In FIG. 9, the output of the variable voltage supply in the first stage is the fixed value V0. The input voltage is also fixed.

The function generator 107 divides the difference between the peak value Vp of the input voltage distribution and the input voltage in the first stage into n. Here, it is divided into n so that the areas surrounded by the vertical lines of the divided input voltage, the probability density distribution, and y=0 are all equal.

The broken line in the upper part of FIG. 9 shows the relationship between the input voltage divided as described above, and the output voltage of the ET power supply. After generating the function, the function generator 107 determines voltages V1 to Vn of the individual power supplies, except the first stage shown in FIG. 9, centering on Vc which is the highest point of the probability density. In this way, the ET power supply 103 is controlled.

Figure 10A:
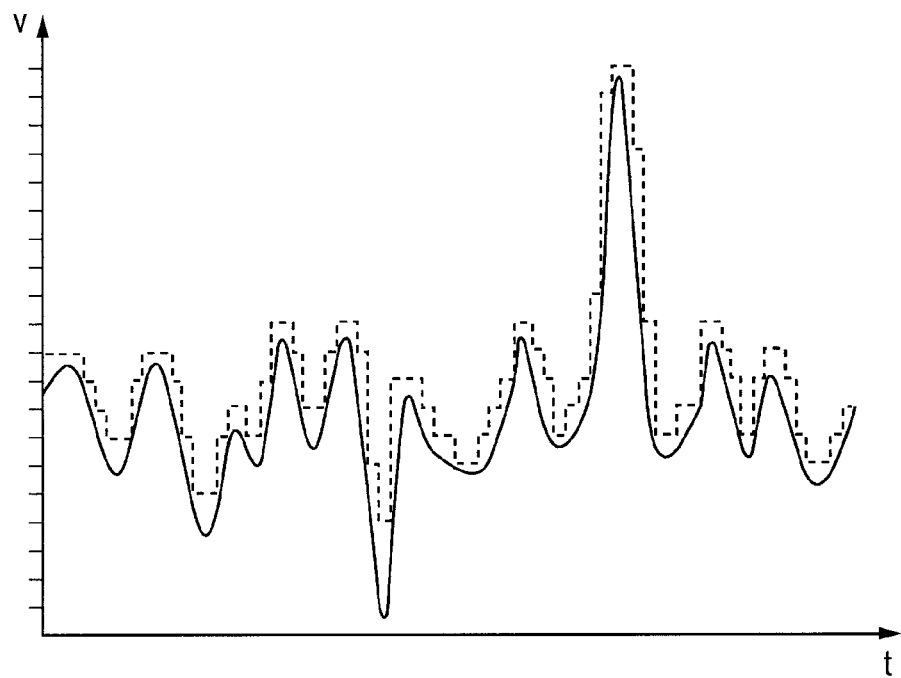
FIG. 10A is a graph showing the output voltage of ET in the conventional technology.
Figure 10B:
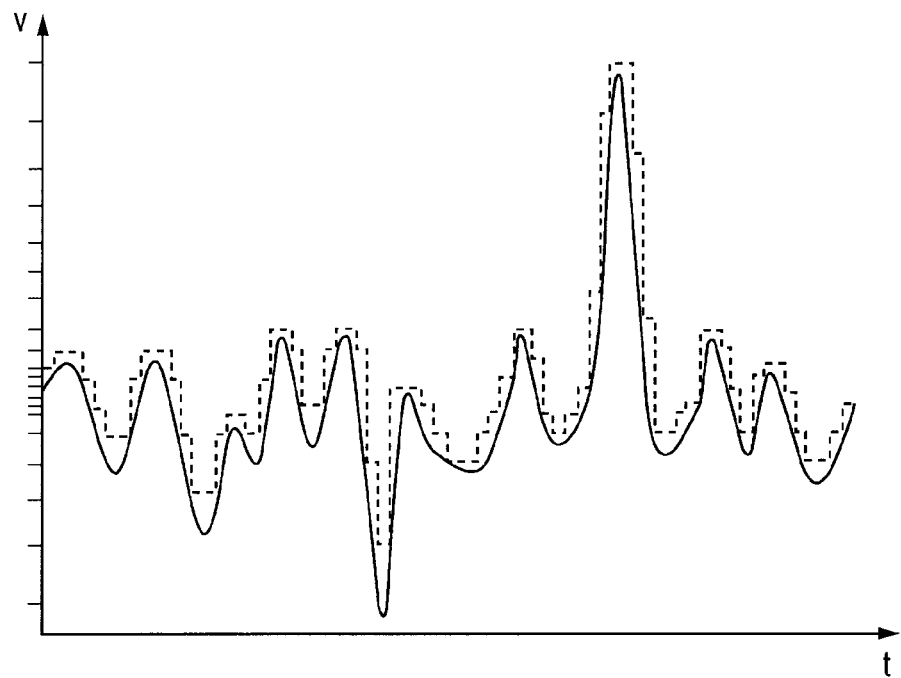
FIG. 10B is a graph showing the output voltage of ET according to a first embodiment.

The input signal to the power amplifier 104 as well as the output voltage from the ET power supply 103 will be described with reference to FIGS. 10A and 10B. In FIGS. 10A and 10B, the vertical axis represents the voltage, and the horizontal axis represents the time. Further, the solid line represents the input signal, and the discrete dashed line represents the output voltage. As is apparent from the scale of the vertical axis, FIG. 10A shows the output of the ET power supply of the fixed voltage supply according to the conventional technology while FIG. 10B shows the output of the ET power supply of the variable voltage supply according to the first embodiment. Note that, in FIGS. 10A and 10B, the input signal is shown with the occurrence probability of the signal voltage following the probability density distribution shown in FIG. 6. It can be found that the tracking is more accurate in FIG. 10B than in FIG. 10A in the voltage range of high occurrence probability.

Figure 11:
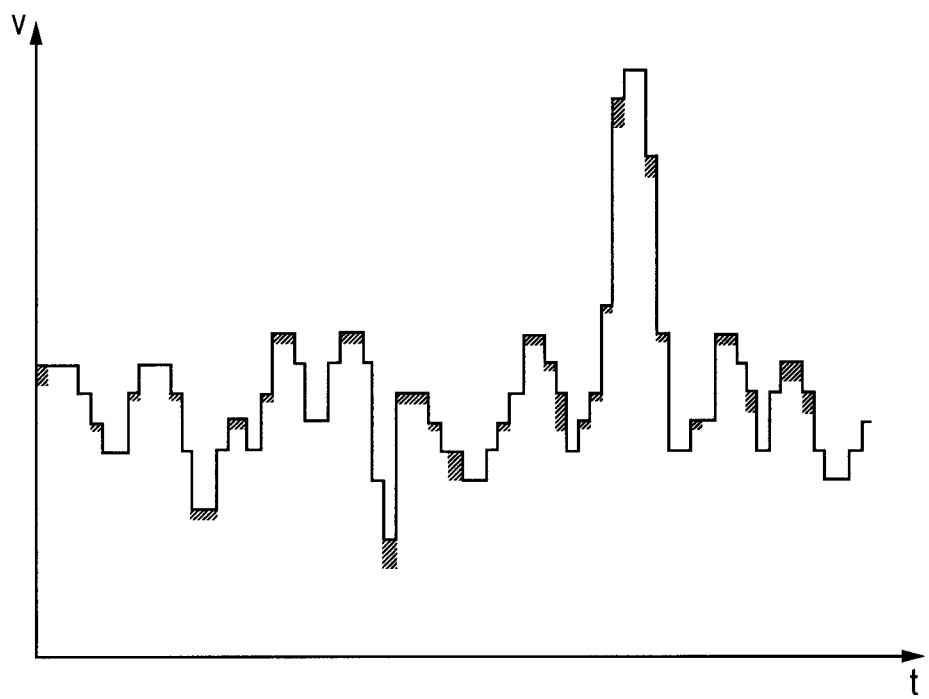
FIG. 11 is a graph showing the difference in the ET power supply output between the first embodiment and the conventional technology.

The contrast between FIGS. 10A and 10B will be simply described with reference FIG. 11. FIG. 11 is a view in which the output voltages in FIGS. 10A and 10B are overlapped. In FIG. 11, the hatching portion is an area where the tracking accuracy in this embodiment is higher than that of the conventional technology. The increase in the tracking accuracy increases the PAE of the power amplifier 104. Thus, in this embodiment, the ET power supply 103 can be controlled at higher PAE than in the conventional technology.

Second Embodiment

A second embodiment is designed to improve the PAE by further reducing the output dynamic range required by the ET power supply by combining with PFR. Note that the configuration shown in FIGS. 7 and 8 are used also in the second embodiment. However, a PFR processor (not shown) is implemented in the digital unit 105 within the transmission signal processor 100. The other operations are the same as those in the first embodiment.

Figure 12:
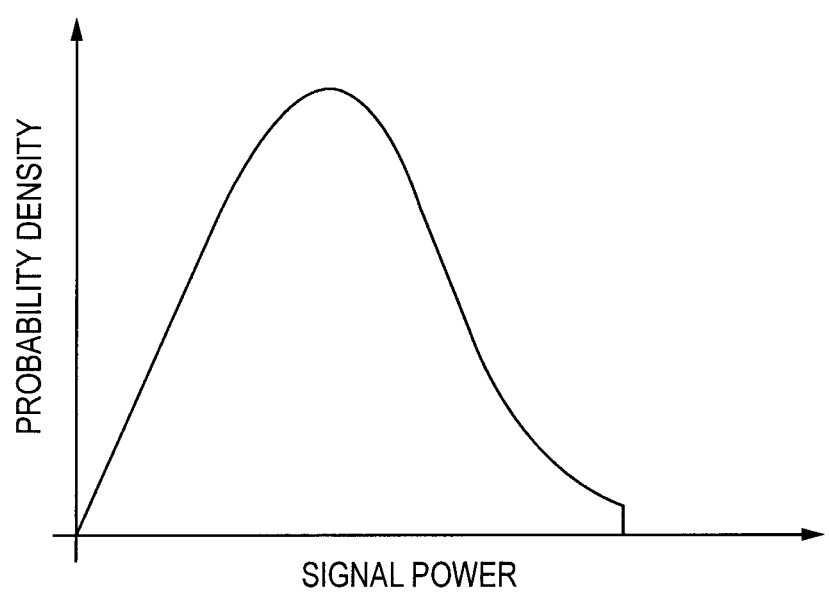
FIG. 12 is a view showing the power distribution of the digitally modulated signal in a second embodiment.

The probability density distribution in PFR process will be described with reference to FIG. 12. In FIG. 12, the vertical axis represents the probability density and the horizontal axis represents the signal power. As a result of the PFR process, the upper limit of the signal power appears, and the probability density in the vicinity of the upper limit increases. When the PFR process is performed, the maximum value of the signal input to the power amplifier 104 is reduced. This phenomenon will be described with reference to FIG. 9. The maximum value of the input signal voltage Vp is reduced because of the PFR process. Thus, the maximum power value to be output from the ET power supply 103 is reduced, so that more power supplies can be used in the power range of high occurrence probability. As a result, highly accurate tracking can be achieved.

Figure 13:
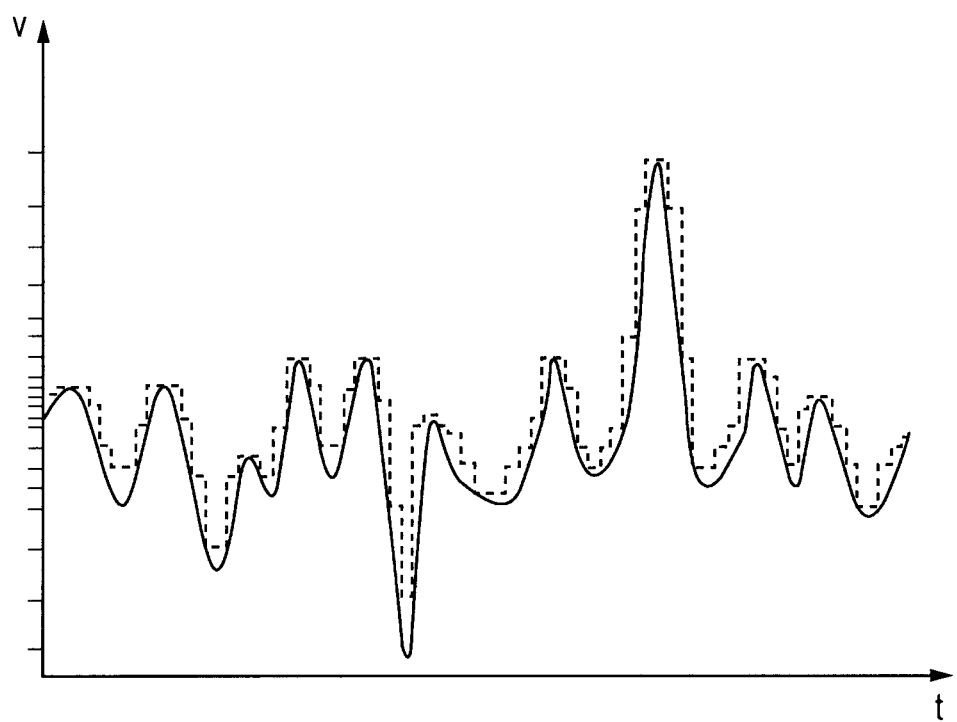
FIG. 13 is a graph showing the output voltage of ET according to the second embodiment.

The input signal to the power amplifier 104 as well as the output voltage from the ET power supply 103 will be described with reference to FIG. 13. In FIG. 13, the vertical axis represents the voltage and the horizontal axis represents the time. Further, the solid line represents the input signal, and the discrete dashed line represents the output voltage. As is apparent from the scale of the vertical axis, the peak voltage shown in FIG. 13 is lower than the peak voltage shown in FIG. 10B.

According to the second embodiment, the PAE of the power amplifier 104 is higher than the case without using PFR.

Third Embodiment

A radio transmitter according to a third embodiment will be described with reference to FIGS. 14 to 19. The radio transmitter of the first and second embodiments assumes the Rayleigh distribution as the transmission output distribution. However, the radio transmitter according to the third embodiment measures the transmission output distribution to control the ET power supply.

Figure 14:
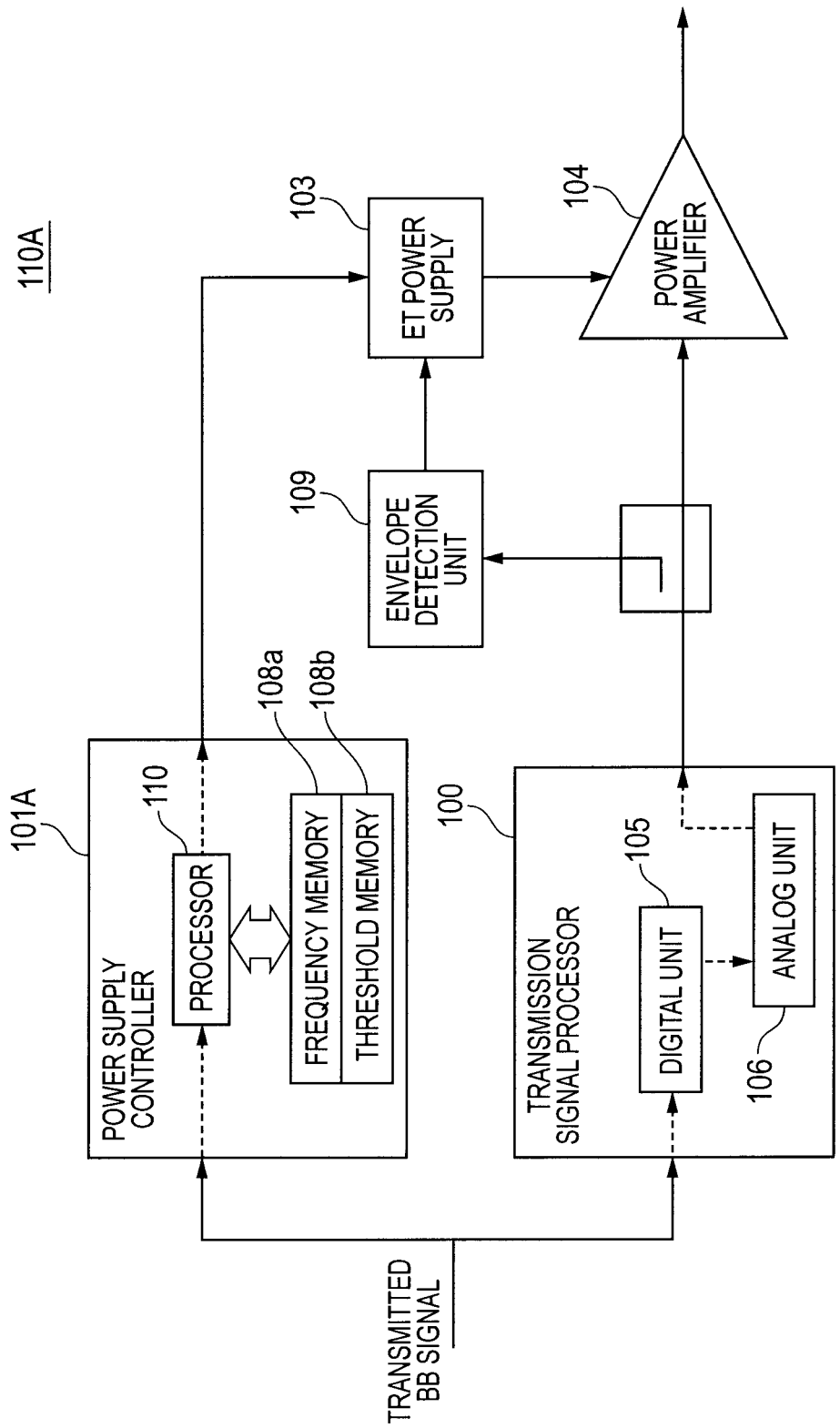
FIG. 14 is a block diagram of a radio transmitter.

The configuration of the radio transmitter will be described with reference to FIG. 14. In FIG. 14, a radio transmitter 110A includes a transmission signal processor 100, a power amplifier 104, an ET power supply 103, an envelope detection unit 109, and a power supply controller 101A. The transmission signal processor 100 includes a digital unit 105 and an analog unit 106. The power controller 101A includes a processor 110 and a memory 108. Further, the memory 108 includes a frequency memory 108a and a threshold memory 108b.

The threshold memory 108b stores a plurality of thresholds which are power voltages. Note that the number of thresholds is equal to the number of power supply stages. The frequency memory 108a stores a plurality of occurrence frequencies of the transmitted BB signal with respect to the voltage in a zone between a threshold and the other threshold.

The digital unit 105 receives a transmitted base band (BB) signal that is transmitted from the upper device. The digital unit 105 sets the transmission power, the transmission frequency, the number of transmission carriers, and the like, and transmits them to the analog unit 106. The analog unit 106 converts the BB signal received from the digital unit 105 into an analog high frequency signal. Then, the analog unit 106 outputs the analog high frequency signal to the power amplifier 104.

The envelope detection unit (envelope detector) 109 detects the envelope from the analog signal. The envelope detector 109 can detect the envelope also from a digital signal. In this case, however, the envelope detector is included in the digital unit 105. For this reason, the position of the envelope detector is not limited to the position shown in FIG. 14.

The transmitted base band signal (transmitted BB signal) is supplied to the power supply controller 101A and also to the transmission signal processor 110. The power amplifier 104 amplifies the transmission signal. Then, the power amplifier transmits the signal from a transmission antenna not shown.

Figure 15:
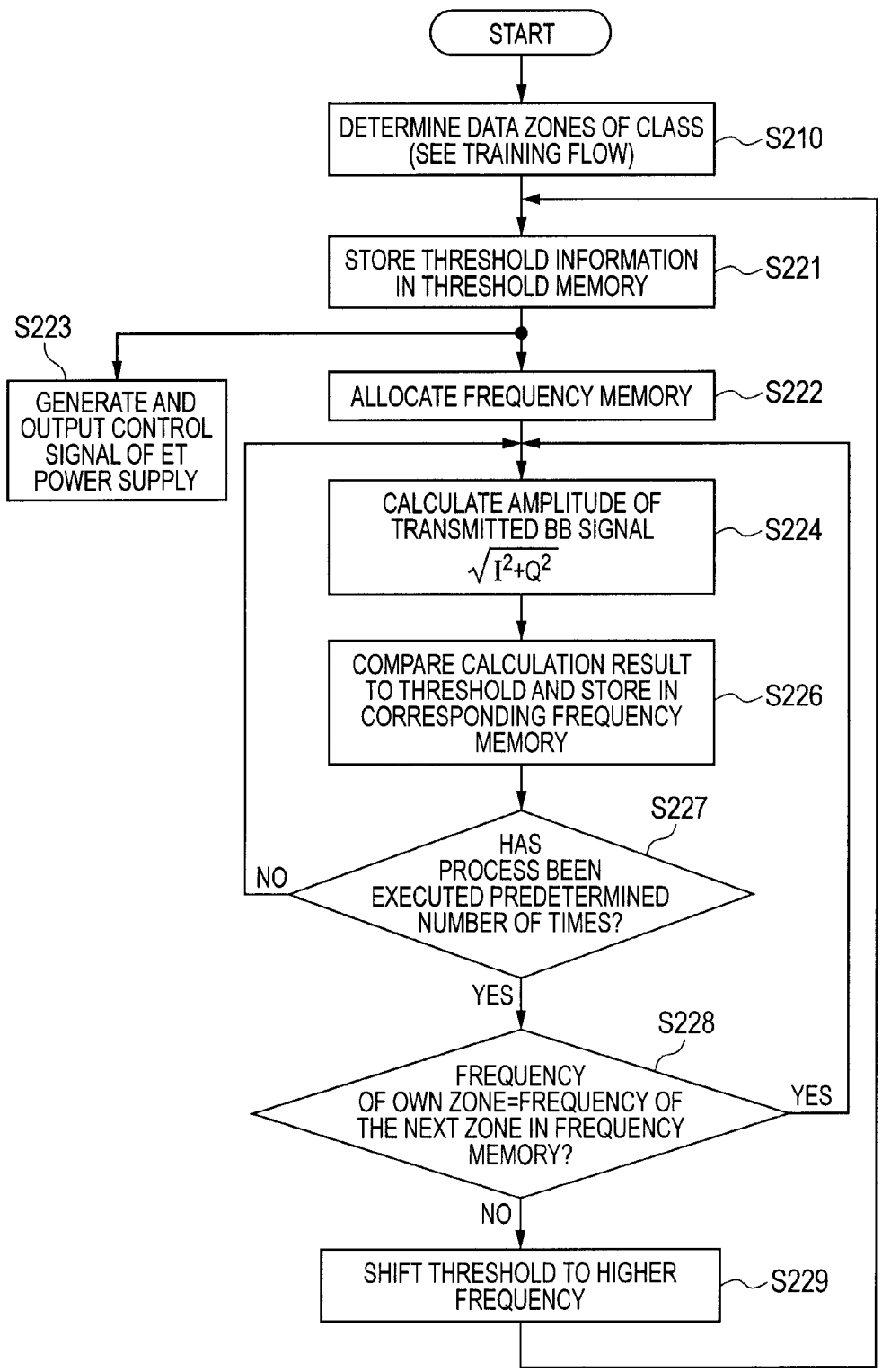
FIG. 15 is a process flow chart of the radio transmitter.

The process flow of the power supply controller 101A will be described with reference to FIG. 15. This process flow starts at power on. In FIG. 15, the power supply controller 101A determines data zones of class (S210). The power supply controller 101A stores the threshold information in the threshold memory (S221). The power supply controller 101A allocates the frequency memory (S222). At the same time, the power supply controller 101A generates a control signal of the ET power supply, and outputs the generated control signal (S223). After step 222, the power supply controller 101A calculates the amplitude of the transmitted BB signal ($\sqrt{I^2+Q^2}$) (S224). The power supply controller 101A compares the calculation result to a plurality of thresholds, and stores the result in the corresponding frequency memory (S226).

The power supply controller 101A determines whether the process has been executed for a predetermined number of times (S227). When the answer is yes, the power supply controller 101A determines whether the frequency in the own zone is equal to the frequency in the next zone in the frequency memory (S228). When the answer is yes, the power supply controller 101A moves to step 224. If no in step 228, the power supply controller 101A shifts the threshold to the higher frequency (S229), and moves to step 221. If no in step 227, the power supply controller 101A moves to step 224.

Note that to simplify the drawing, it is shown that step 228 and step 229 are performed only once, but actually the steps 228 and 229 are performed for the number of times equal to the number of power supply stages minus one. The power supply controller 101A moves to step 224 when the frequencies of all the zones are equal.

Figure 16:
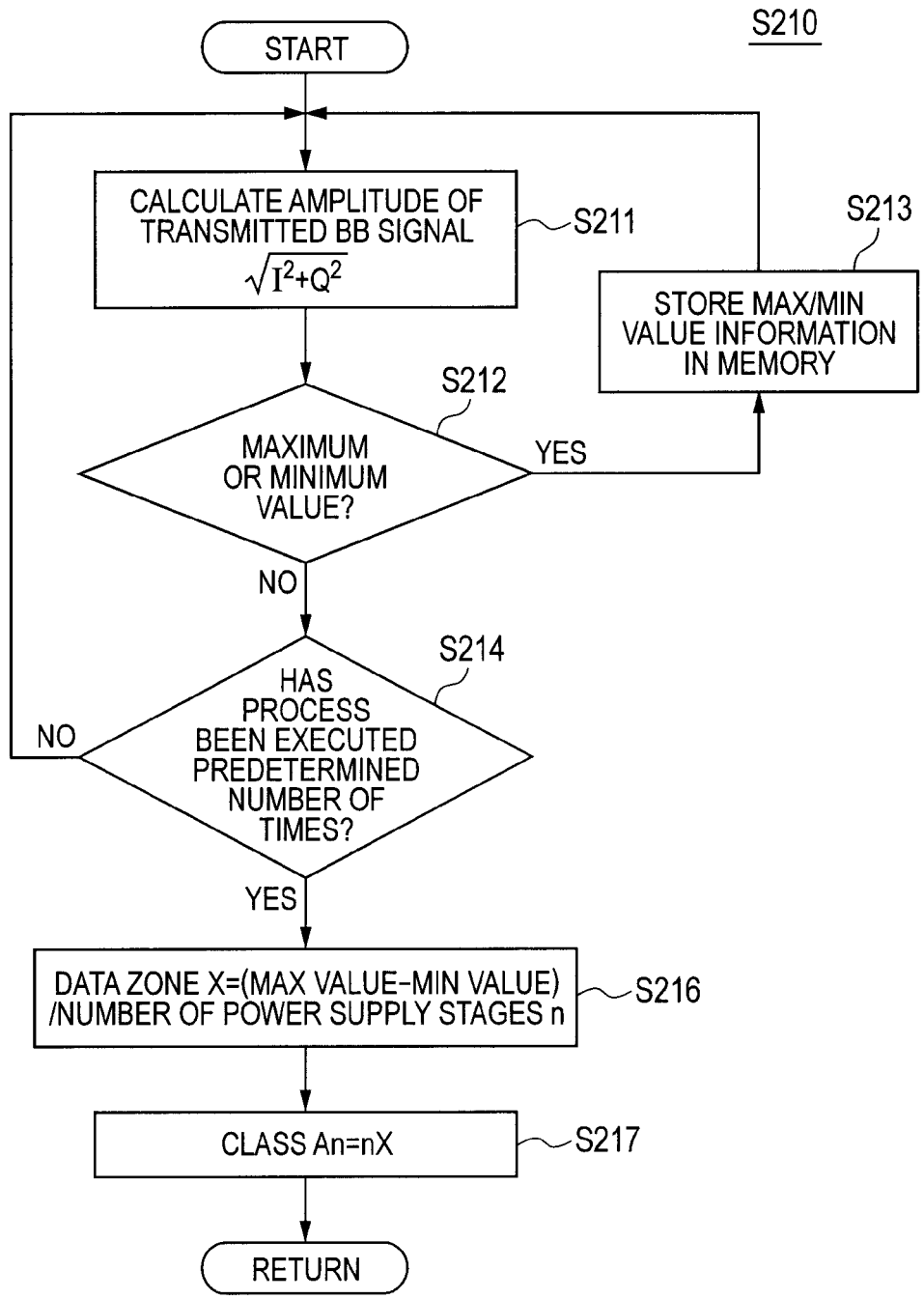
FIG. 16 is a training flow chart.

The training flow will be described with reference to FIG. 16. In FIG. 16, the power supply controller 101A calculates the amplitude of the transmitted BB signal ($\sqrt{I^2+Q^2}$) (S211). The power supply controller 101A determines whether the amplitude is the maximum or minimum value. When the answer is yes, the power supply controller 101A stores the maximum/minimum value information in the memory (S213) and moves to step 211.

If no in step 212, the power supply controller 101A determines whether the process has been executed for a predetermined number of times (S214). When the answer is yes, the power supply controller 101A sets the value of data zone X to (the maximum value−the minimum value)/the number of power supply stages n (S216). The power supply controller 101A sets the class An=nX (S217) and then returns. If no in step 214, the power supply controller 101A moves to step 211.

The transition of the values stored in the threshold memory will be described with reference to FIG. 17. In FIG. 17, it is assumed that the number of stages n of the ET power supply is 10. The figure (a) shows the initial value. The threshold memory 108b is divided into 10 zones. Each zone of the threshold memory 108b holds 0. The figure (b) shows the threshold memory 108b during training. The left end zone (called zone 1) holds 5 which is the minimum value of the power supply output. Then, zone 2 holds 33 which is the maximum value of the power supply output, while zones 3 to 10 remain holding 0.

The figure (c) shows the threshold memory 108b after the completion of the training. The zone 1 holds 0 which is the minimum value of the power supply output, and the zone 2 holds 40 which is the maximum value of the power supply output. The figure (d) shows the threshold memory 108b after the completion of the threshold calculation. Here, (The maximum value−the minimum value)/the number of power supply stages $n=(40-0)/10=4$ Thus, the zone width is 4, and the zone 1 holds 4, the zone 2 holds 8, and then the zone 10 holds 40 in the same manner. The figures (e) and (f) show the values of the threshold memory 108b in the learning process. The threshold memory 108b changes each value of the threshold only by 1 so that the frequencies of the zones held in the frequency memory 108b are averaged. However, the maximum value 40 is fixed. In FIG. 17, the state of (f) is such that the zone widths of the thresholds from the zone 1 to the zone 10 are as follows in this order: 8, 4, 3, 3, 3, 3, 3, 2, 3, 8. Note that the greater the difference, the more the threshold value can be changed.

The transition of the values held in the frequency memory 108a will be described with reference to FIG. 18. In FIG. 18, similarly to FIG. 17, it is assumed that the number of stages n of the ET power supply is 10. The figure (a) shows the initial value. The threshold memory 108a is divided into 10 zones. Each zone of the threshold memory 108a holds 0. The figure (b) shows the frequency data when the process has been executed for a predetermined number of times with even threshold width. The figures (c) and (d) show the values of the frequency memory 108a in the learning process. In FIG. 18, (b), (c), (d) show the frequency data when the process has been executed for a predetermined number of times in the threshold state of (d), (e), (f) in FIG. 17. It can be understood that the frequency data are averaged in the order from (b), (d), (d) in FIG. 18.

Note that the zone shown under each frequency includes 0 only when the particular zone includes 0, and the other zones do not include the lower limit. In other words, the zones 0 to 4 are 0 or more and 4 or less, and the zones 4 to 8 exceed 4 and are 8 or less.

Figure 19A:
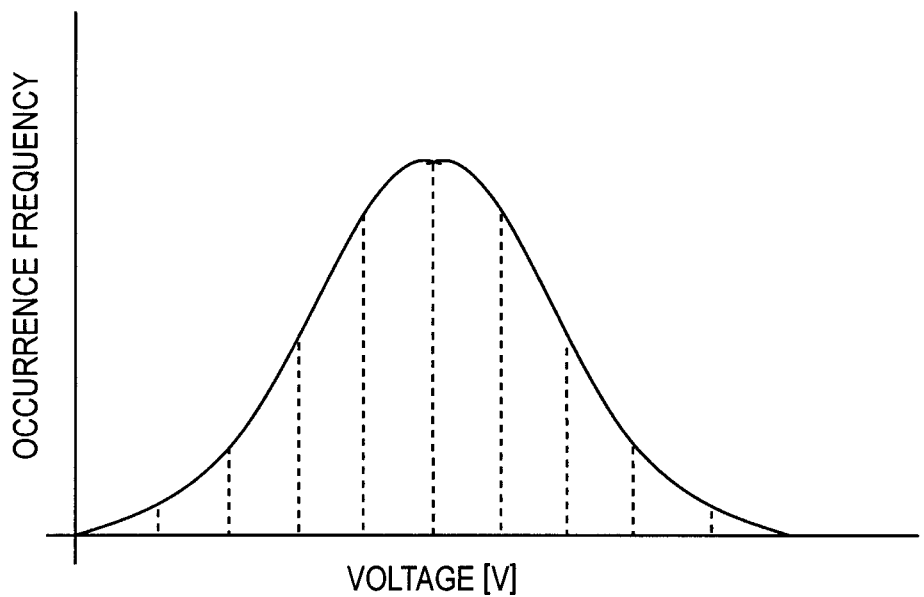
FIGS. 19A and 19B are views showing the input signal level distribution and the voltage division pattern.
Figure 19B:
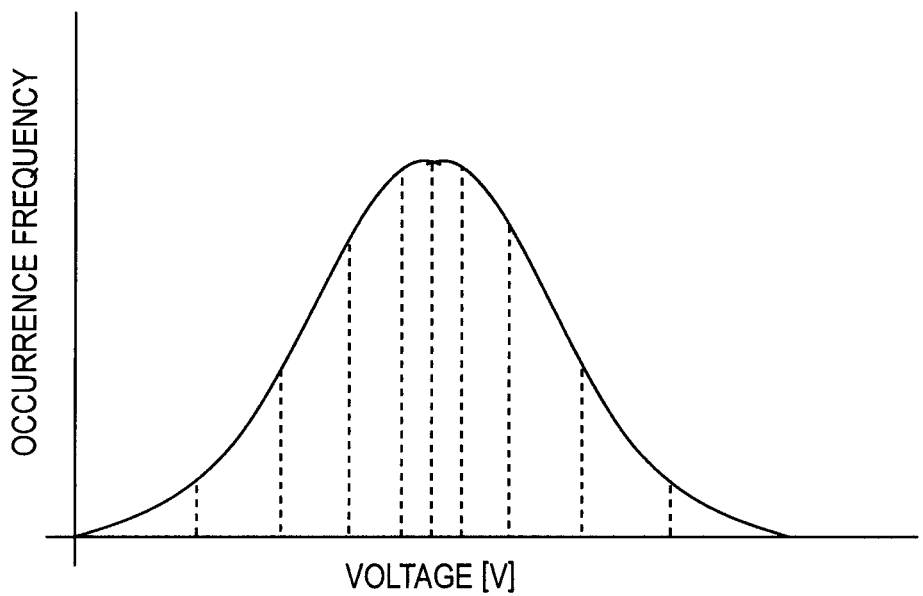

The relationship between the input signal level distribution and the ET power supply voltage division pattern will be described with reference to FIGS. 19A and 19B. Here, the horizontal axis represents the voltage and the vertical axis represents the occurrence frequency. FIG. 19A shows the power supply voltage division pattern in the initial state. FIG. 19B shows the power supply voltage division pattern after learning. It can be understood that the power supply voltage is precisely divided in the area of high occurrence frequency from the comparison between FIGS. 19A and 19B.

According to the third embodiment, whatever the distribution of the input signal is, it is possible to track the distribution and precisely divide the power supply voltage in the area of high occurrence frequency.

What is claimed is:

1. A radio transmitter comprising:
an envelope tracking power supply for supplying power to a power amplifier;
the power amplifier for amplifying an analog high frequency signal; and
a power supply controller for controlling the envelop tracking power supply,
wherein the envelope tracking power supply includes a plurality of variable voltage supplies, and
wherein the power supply controller controls the plurality of variable voltage supplies so as to precisely divide the power supply voltage in a high frequency area, based on the voltage distribution of a received transmitted base band signal.

2. The radio transmitter according to claim 1,
wherein the power supply controller includes:
a threshold memory including a plurality of first interval zones; and
a frequency memory including a plurality of second interval zones, and
wherein the power supply controller changes the threshold held in the first interval zones so that each of the second interval zones approaches the average of the second interval zones.

* * * * *